United States Patent
Fuchs et al.

(10) Patent No.: US 12,454,756 B2
(45) Date of Patent: Oct. 28, 2025

(54) DEVICE, SYSTEM AND METHOD FOR PLASMA-ENHANCED CHEMICAL VAPOR DEPOSITION

(71) Applicant: centrotherm international AG, Blaubeuren (DE)

(72) Inventors: Jens-Uwe Fuchs, Blaubeuren (DE); Mirko Tröller, Blaubeuren (DE); Ralf Reize, Blaubeuren (DE); Roland Leichtle, Blaubeuren (DE)

(73) Assignee: centrotherm international AG, Blaubeuren (DE)

( * ) Notice: Subject to any disclaimer, the term of this patent is extended or adjusted under 35 U.S.C. 154(b) by 5 days.

(21) Appl. No.: 18/245,390

(22) PCT Filed: Sep. 14, 2021

(86) PCT No.: PCT/DE2021/100759
§ 371 (c)(1),
(2) Date: Mar. 15, 2023

(87) PCT Pub. No.: WO2022/057978
PCT Pub. Date: Mar. 24, 2022

(65) Prior Publication Data
US 2023/0349046 A1    Nov. 2, 2023

(30) Foreign Application Priority Data

Sep. 15, 2020   (DE) ............... 10 2020 124 030.9

(51) Int. Cl.
*C23C 16/458*    (2006.01)
*C23C 16/509*    (2006.01)
(Continued)

(52) U.S. Cl.
CPC ........ *C23C 16/4586* (2013.01); *C23C 16/509* (2013.01); *C23C 16/5096* (2013.01); *C23C 16/52* (2013.01); *H01J 37/3244* (2013.01); *H01J 37/32522* (2013.01); *H01L 21/67109* (2013.01)

(58) Field of Classification Search
None
See application file for complete search history.

(56) References Cited

U.S. PATENT DOCUMENTS 5,226,056 A * 7/1993 Kikuchi ............ H01L 21/68742
  204/192.1
6,375,750 B1   4/2002 Van Os et al.
(Continued)

FOREIGN PATENT DOCUMENTS

CN        1189859 A      8/1998
DE   102015004352 A1   10/2016
(Continued)

*Primary Examiner* — Aiden Lee
(74) *Attorney, Agent, or Firm* — Laurence A. Greenberg; Werner H. Stemer; Ralph E. Locher

(57) ABSTRACT

A device for plasma-enhanced chemical vapor deposition includes a process chamber configured to receive at least one workpiece carrier. The device is configured to heat the process chamber with the aid of at least one workpiece carrier that can be received by the process chamber. A system and a method for plasma-enhanced chemical vapor deposition are also provided.

14 Claims, 3 Drawing Sheets

(51) Int. Cl.
*C23C 16/52* (2006.01)
*H01J 37/32* (2006.01)
*H01L 21/67* (2006.01)

(56) References Cited

U.S. PATENT DOCUMENTS

| | | | |
|---|---|---|---|
| 10,867,825 B2 | 12/2020 | Klick et al. | |
| 11,169,123 B2 | 11/2021 | Oikawa et al. | |
| 2009/0133628 A1* | 5/2009 | Dahl | C23C 16/458 |
| | | | 118/718 |
| 2010/0207527 A1* | 8/2010 | Hruby | F03H 1/0018 |
| | | | 315/111.01 |
| 2018/0066354 A1* | 3/2018 | Klick | H01J 37/32715 |
| 2018/0076071 A1* | 3/2018 | Klick | H01J 37/3299 |
| 2018/0247842 A1 | 8/2018 | Piela et al. | |
| 2021/0151302 A1 | 5/2021 | Schlemm et al. | |

FOREIGN PATENT DOCUMENTS

| | | |
|---|---|---|
| DE | 102018109738 B3 | 10/2019 |
| EP | 3422396 A1 | 1/2019 |
| JP | H0641757 A | 2/1994 |
| JP | 2008016476 A | 1/2008 |
| WO | 2004013901 A2 | 2/2004 |
| WO | 2017220268 A1 | 12/2017 |

\* cited by examiner

DEVICE, SYSTEM AND METHOD FOR PLASMA-ENHANCED CHEMICAL VAPOR DEPOSITION

FIELD AND BACKGROUND OF THE INVENTION

The present invention relates to a device, a system, and a method for plasma-enhanced chemical vapor deposition.

The method of chemical vapor deposition (CVD) is known for coating substrates. At least one gas is provided, which contains the substance to be deposited. The substance is deposited on the substrate by running a chemical reaction, which is drivable by temperature, for example. With the aid of chemical vapor deposition, for example, microelectronic components or optical fibers can be produced.

The deposition rate may be increased further by generating a plasma on the basis of the gas. Moreover, the deposition reaction can also already be effectively driven at lower temperatures in this way. This variant of chemical vapor deposition is typically referred to as plasma-enhanced chemical vapor deposition (PECVD).

To reach the required process temperature, workpiece carriers for carrying the substrates, for example semiconductor wafers, are typically inserted into a reaction chamber having heatable walls. Such reaction chambers are sometimes also referred to as hot wall reactors. The heating typically takes place via resistance heating elements, which are installed on or in the process chamber wall.

SUMMARY OF THE INVENTION

It is an object of the present invention to further improve plasma-enhanced chemical vapor deposition, in particular to increase its efficiency.

This object is achieved by the device, the system, and the method for plasma-enhanced chemical vapor deposition described below.

A device according to a first aspect of the invention for plasma-enhanced chemical vapor deposition has a process chamber for receiving at least one workpiece carrier. According to the invention, the device is configured to heat the process chamber with the aid of at least one workpiece carrier receivable by the process chamber, preferably up to a process temperature for chemical vapor deposition.

Heating in the meaning of the invention is active heating, in which at least one component is used in a dedicated manner for heating. Heating also includes only temporary heating here. During the heating of the process chamber with the aid of at least one received workpiece carrier, the workpiece carrier can thus be operated, for example, as a heating unit. Passive heating, for example via waste heat, in contrast, is not heating in the meaning of the invention. Warming up of a process chamber due to heating of electrodes of a workpiece carrier as a result of plasma generation is thus in particular not heating in the meaning of the invention.

One aspect of the invention is based on the approach of designing a device for plasma-enhanced chemical vapor deposition in such a way that a process chamber for receiving at least one workpiece carrier is actively heatable exclusively via at least one receivable workpiece carrier. The device can be designed here in particular in such a way that the process chamber is heatable with the aid of the workpiece carrier independently of a process gas inserted into the process chamber and/or a vacuum generated in the process chamber.

A vacuum is characterized in the meaning of the invention by a pressure below the air pressure acting on the device. In other words, a vacuum in the meaning of the invention designates a negative pressure within the process chamber in relation to the surroundings of the device, for example a pressure below essentially 1 bar.

The device can thus, for example, be configured to operate the workpiece carrier as a heating unit. Due to the ability to heat the process chamber with the aid of a workpiece carrier accommodated therein, a separate heating system for the device, for example in the form of heating elements installed in the area of the process chamber or a heating cartridge, can be omitted. The device can therefore be conceived more simply and produced more cost-effectively. Moreover, the process chamber can be operated as a so-called "cold wall reactor", due to which the operating safety may be increased. Furthermore, by omitting the separate heating system, inadvertent heating of the process chamber when the workpiece carrier is not inserted can be avoided or corresponding complex safety mechanisms, which permit heating only when a workpiece carrier is received, can be omitted.

In addition, installation space in the process chamber can be saved using a device configured for heating the process chamber with the aid of a receivable workpiece carrier and the process chamber can therefore be made more compact. The volume to be heated and the mass to be heated located therein may thus be reduced. This enables shortening of the time required to reach the process temperature at equal heating power. The device may thus be operated not only energy efficiently, rather the processing of workpieces may be accelerated and the throughput may be increased accordingly.

The device expediently has a control unit, which is configured to control the heating of the process chamber with the aid of the at least one receivable workpiece carrier. The control unit can be configured in particular to operate the at least one received workpiece carrier as a heating unit. The control unit can be configured, for example, to establish an interconnection of the workpiece carrier with a current and/or voltage source, so that a heating current flows through at least a part of the workpiece carrier. A heating current can be a low-frequency alternating current for this purpose, for example an alternating current having a frequency of less than 1 kHz, preferably of approximately 50 Hz. A part of the workpiece carrier, for example multiple electrodes connected in series, can be used here as a heating resistor.

Preferred embodiments of the invention and their refinements are described hereinafter, which, if not expressly excluded, can each be combined with one another arbitrarily and with the aspects of the invention described hereinafter.

In one preferred embodiment, the device has a switching unit, which is configured to connect the at least one workpiece carrier received by the process chamber selectively to at least one heating voltage source or a plasma voltage source. The heating voltage source is expediently configured to provide a low-frequency AC voltage for heating the process chamber, and the plasma voltage source is expediently configured to provide a high-frequency AC voltage to generate the plasma. A low-frequency AC voltage has in this case a frequency of 1 kHz or less, for example 50 Hz, and a high-frequency AC voltage has a frequency of 1 kHz or more, for example 40 kHz. The switching unit is preferably configured to integrate the workpiece carrier received in the process chamber selectively into a plasma circuit for conducting high-frequency alternating current or at least one heating circuit for conducting low-frequency alternating current. The switching unit can in particular be configured to integrate the workpiece carrier received by the process chamber for operation as a plasma unit selectively in a single plasma circuit for conducting high-frequency alternating current and for operation as a heating unit in at least two, preferably parallel heating circuits for conducting low-frequency alternating current. Various operating modes of the at least one received workpiece carrier can thus be implemented with the aid of the switching unit.

The heating voltage source is configured, for example, to provide the low-frequency AC voltage at an effective voltage of 145 V and an effective amperage of greater than 90 A, for example 120 A. The plasma voltage source is configured, for example, to provide the high-frequency AC voltage at an effective voltage of 800 V to 1000 V and an effective amperage of less than 90 A, for example 75 A.

In a further preferred embodiment, the switching unit has at least two switch assemblies, which are configured to interrupt electrically conductive connections of the at least one heating voltage source and the plasma voltage source to a power connection, to which a workpiece carrier is connectable. The switch assemblies can be configured in particular to interrupt electrical lines from the at least one heating voltage source or the plasma voltage source to contact pins of the power connection, also designated as current lances. Each of the switch assemblies can have at least one switch integrated in one of the lines here. The at least one heating voltage source and the plasma voltage source can thus be connected to the at least one receivable workpiece carrier independently of one another.

The control unit for controlling the heating of the process chamber with the aid of the at least one receivable workpiece carrier is preferably part of the switching unit. The control unit is expediently configured to control the at least two switch assemblies. The control unit can be configured, for example, for opening or closing the switch assemblies. In particular, the control unit can be configured to disconnect the heating voltage source from the workpiece carrier and connect the plasma voltage source to the workpiece carrier by appropriate actuation of the switch assemblies upon the presence of a switching signal. The switching signal can be, for example, a switching signal generated by a user and provided via a user interface. Alternatively or additionally, the switching signal can also be generated by the control unit, for example when the temperature of the workpiece carrier or its surroundings reaches or exceeds the process temperature. For this purpose, the control unit can be connected to a temperature sensor, which is configured to ascertain or at least to estimate the workpiece carrier temperature or ambient temperature.

In a further preferred embodiment, the device has a power connection, to which a workpiece carrier receivable by the process chamber is connectable. The power connection preferably comprises at least four contact pins for electrically contacting a workpiece carrier receivable by the process chamber. At least two circuits of the workpiece carrier can thus be supplied with current and/or voltage independently of one another.

The contact pins can protrude, for example, out of a wall of the process chamber and can be arranged in such a way that they contact contact points provided for electrical connection on the workpiece carrier when it is received by the process chamber. It is conceivable in particular that the contact pins are designed to engage in corresponding, preferably conical boreholes on the workpiece carrier. The contact pins can thus slide into the boreholes upon insertion of the workpiece carrier into the process chamber and the contact pins can be guided here into a provided position. A particularly reliable electrical connection of the workpiece carrier to the device is thus achievable. To be able to ensure a minimal contact pressure of the contact pins when the at least one workpiece carrier is received by the process chamber, it is also conceivable that the contact pins are spring-loaded inside the process chamber.

In a further preferred embodiment, the contact pins are arranged in the area of a rear wall of the process chamber. A rear wall is to be understood here as the wall of the process chamber on a side which is opposite to at least one opening for inserting the workpiece carrier into the process chamber. The contact pins are preferably arranged in such a way that the contact pins contact the at least one workpiece carrier automatically when it is received by the process chamber. The contact pins can be arranged, for example, in such a way that the contact pins come into contact with corresponding contact points of the workpiece carrier at the end of the insertion of the at least one workpiece carrier into the process chamber. The operation of the device may thus be facilitated. On the one hand, an additional contacting step can be dispensed with, in which the at least one workpiece carrier receivable by the process chamber has to be actively interconnected with the device. On the other hand, the correct interconnection of the workpiece carrier does not have to be explicitly ensured. Rather, this can result solely due to the complete insertion of the workpiece carrier into the process chamber.

In a further preferred embodiment, the process chamber is configured to receive two workpiece carriers, in particular adjacent to one another. The process chamber is expediently formed appropriately wide for this purpose, namely at least twice as wide as a single workpiece carrier. The process chamber can accordingly also have two power connections for separately connecting each workpiece carrier. The dimensioning of the process chamber to receive two workpiece carriers enables the throughput to be increased.

In a further preferred embodiment, the process chamber has two closable openings arranged adjacent to one another for inserting the at least one workpiece carrier into the process chamber. The two openings are preferably separated from one another by a stop web, on which, for example, doors or flaps for closing the openings can stop. Two workpiece carriers can thus be inserted into the process chamber or removed from the process chamber independently of one another.

In a further preferred embodiment, the process chamber is made essentially rectangular and is configured to receive at least one workpiece carrier having essentially rectangular cross section. The process chamber volume is thus optimally adapted to the profile of the workpiece carrier. In particular, the dead volume in the process chamber can be minimized. This permits an optimum design of a gas discharge system, in particular of vacuum pumps, for generating a vacuum in the process chamber and enables a reduction of the consumption of process gas fed into the process chamber.

In a further preferred embodiment, the process chamber has at least one reflection unit, which is configured to reflect electromagnetic radiation emitted by the at least one receivable workpiece carrier, in particular thermal radiation in the infrared range of the electromagnetic spectrum, back toward the workpiece carrier. The at least one reflection unit can have multiple, preferably rectangular plates for this purpose, for example. The at least one reflection unit enables even more efficient operation of the device. In particular, a duration until a predetermined process temperature is reached in the process chamber may be reduced with the aid of the at least one reflection unit, so that the throughput can be increased. Energy can thus also be saved at the same time.

The multiple plates expediently form a stack, using which the electromagnetic radiation is reflected particularly effectively. The plates can be manufactured here from various materials, which are each particularly suitable for reflecting a specific wavelength. By stacking such plates to form a reflection unit, electromagnetic radiation can also be effectively reflected over a broad wavelength range.

In a further preferred embodiment, the process chamber has at least three reflection units, which are arranged essentially at right angles to one another in such a way that with a workpiece carrier received in the process chamber, they are positioned above and along two opposing longitudinal sides of the workpiece carrier. At least the largest part of the electromagnetic radiation emitted by the at least one receivable workpiece carrier can thus be reflected. In particular, a larger angle range around the at least one receivable workpiece carrier may thus be covered with the aid of the reflection units. In addition to increased energy efficiency and an acceleration of the heating process, the mentioned arrangement of the reflection units also permits reliable limiting of the wall temperatures of the process chamber.

In a further preferred embodiment, the device has a gas feed system for feeding process gas into the process chamber.

The gas feed system preferably comprises multiple injectors. The injectors are expediently arranged in the area of a ceiling of the process chamber to feed process gas, when a workpiece carrier is received, above the workpiece carrier, so that process gas can expediently be fed from above. The injectors can be installed for this purpose, for example, in the ceiling of the process chamber. Providing multiple injectors, which fluidically connect the process chamber, for example, to at least one gas feed line, permits particularly uniform distribution of the process gas to be fed in the process chamber. Workpieces carried by the workpiece carrier are thus also processable particularly uniformly.

The multiple injectors are preferably distributed along the ceiling of the process chamber here, for example in the form of an injector array. The multiple injectors can be arranged in particular along an insertion direction, in which the at least one workpiece carrier is insertable into the process chamber. In particular a row of injectors arranged one behind another—in the insertion direction—can be provided for each workpiece carrier receivable by the process chamber. Two parallel such rows of injectors arranged one behind another are possibly also conceivable, in order to be able to introduce two different process gases. The injectors of each row are expediently fluidically connected to one of two process gas feed lines in each case here and/or are arranged in pairs adjacent to an injector of the respective other series, in order to enable a uniform distribution of the two different process gases.

The injectors are preferably designed like nozzles for the targeted injection of the process gas. In the area of an outlet opening discharging into the process chamber, each of the injectors can be shaped, for example, in such a way that process gas can be blown in the form of a jet, i.e., essentially linearly having only minor divergence, into the process chamber. The process gas may thus be provided in particular in the areas in which at least one component of the process gas is to be deposited on the surface of a workpiece carried by the workpiece carrier, for example between electrodes of the at least one received workpiece carrier. On the one hand, the fed process gas can thus be used particularly efficiently and the consumption of process gas can be reduced accordingly.

In a further preferred embodiment, the injectors designed like nozzles are arranged in such a way that process gas can be blown between multiple electrodes, arranged in parallel, of the at least one receivable workpiece carrier. This can facilitate the generation of a plasma between the electrodes or enables the generation of the plasma already using small quantities of fed gas. The fed gas can thus in particular flow through between the electrodes of the workpiece carrier and can be extracted below the at least one receivable workpiece carrier, without previously (unnecessarily) being distributed in the process chamber.

In a further preferred embodiment, the device has a gas discharge system.

The gas discharge system preferably comprises multiple gas outlets, which are arranged in the area of a bottom of the process chamber to extract gas, when a workpiece carrier is received, below the workpiece carrier. The gas outlets can be formed, for example, as openings in the process chamber bottom. The multiple gas outlets are preferably distributed along the bottom of the process chamber, for example in the form of a gas outlet array. The multiple gas outlets can be arranged in particular along the insertion direction. One gas outlet is preferably provided here for each injector, in particular for each injector pair from two parallel rows of injectors. The process gas may thus be extracted homogeneously from the process chamber. This is advantageous in particular in the case of a homogeneous gas feed via multiple injectors, since undesired concentration differences can be avoided.

A system according to a second aspect of the invention for plasma-enhanced chemical vapor deposition has a device according to the first aspect of the invention for plasma-enhanced chemical vapor deposition and a workpiece carrier, by means of which a process chamber of the device is heatable. The workpiece carrier is preferably designed to be insertable into the process chamber of the device, in particular to be receivable by the process chamber. The workpiece carrier is expediently designed to be operated by the device as a heating unit. For this purpose, the heating unit can have, for example, multiple heating circuits formed by electrodes of the workpiece carrier. The electrodes are preferably used here as heating resistors, to which a low-frequency AC voltage can be applied. In a particularly preferred manner, the workpiece carrier is also designed here to be operated by the device as a plasma unit, using which a plasma can be generated in the process chamber. For this purpose, for example, at least two of the heating circuits can be isolated from one another and can have electrodes adjacent to one another, so that a high-frequency AC voltage can be applied between adjacent electrodes.

In a method according to a third aspect of the invention for plasma-enhanced chemical vapor deposition, a process chamber is heated, according to the invention with the aid of at least one workpiece or workpiece carrier receivable by the process chamber. In other words, the process chamber can be actively heated by the workpiece or the workpiece carrier.

A heating current in the form of a low-frequency alternating current is expediently conducted through the workpiece or the workpiece carrier, for example in that a corresponding AC voltage is applied to the workpiece or the workpiece carrier. For example, the AC voltage can be applied at a frequency of less than 1 kHz, for example at 50 Hz, to an electrode assembly, in particular to multiple electrodes of the electrode assembly connected electrically in series. The electrodes are expediently used here as heating resistors. However, it is also conceivable that the workpiece is used as the heating resistor. Due to the method according to the invention, conventional heating systems arranged in the area of the process chamber do not have to be used to heat the process chamber. For example, separate heating units can be dispensed with and as a result devices having more compact process chambers can be used. This also enables a shortening of a duration which is necessary to reach a process temperature provided for vapor deposition. At the same time, the method complexity may be reduced using the method according to the invention. In individual application cases, higher deposition rates can also be possible.

Before the heating of the process chamber, the workpiece carrier or the workpiece can be inserted into the process chamber, for example via rollers arranged in the process chamber. The workpiece carrier is preferably electrically interconnected, in particular automatically, with a switching unit of the device. For example, the workpiece carrier can be inserted into the process chamber until contact points on the workpiece carrier come into contact with contact pins of a power connection of the device arranged in the area of a rear wall of the process chamber.

The workpiece or the workpiece carrier is expediently operated after the heating as a plasma unit. For this purpose, a high-frequency AC voltage at a frequency of 1 kHz or more, for example 40 kHz, can be applied to the workpiece or the workpiece carrier, in particular the electrodes. The workpiece or the workpiece carrier may thus be used particularly efficiently.

The invention is explained in more detail hereinafter on the basis of figures. If appropriate, identically acting elements are provided with identical reference signs herein. The invention is not restricted to the exemplary embodiments shown in the figures—also not with respect to functional features. The prior description and also the following description of the figures contain numerous features which are reflected in the dependent subclaims, sometimes combined as multiples. These features, like all other features disclosed above and in the following description of the figures, will also be considered individually by a person skilled in the art and combined to form reasonable further combinations. In particular, all mentioned features are each combinable individually and in any suitable combination with the device according to the first aspect of the invention, the system according to the second aspect of the invention, and the method according to the third aspect of the invention.

BRIEF DESCRIPTION OF THE FIGURES

In the figures, which are at least partially schematic.

DETAILED DESCRIPTION OF THE INVENTION

Figure 1:
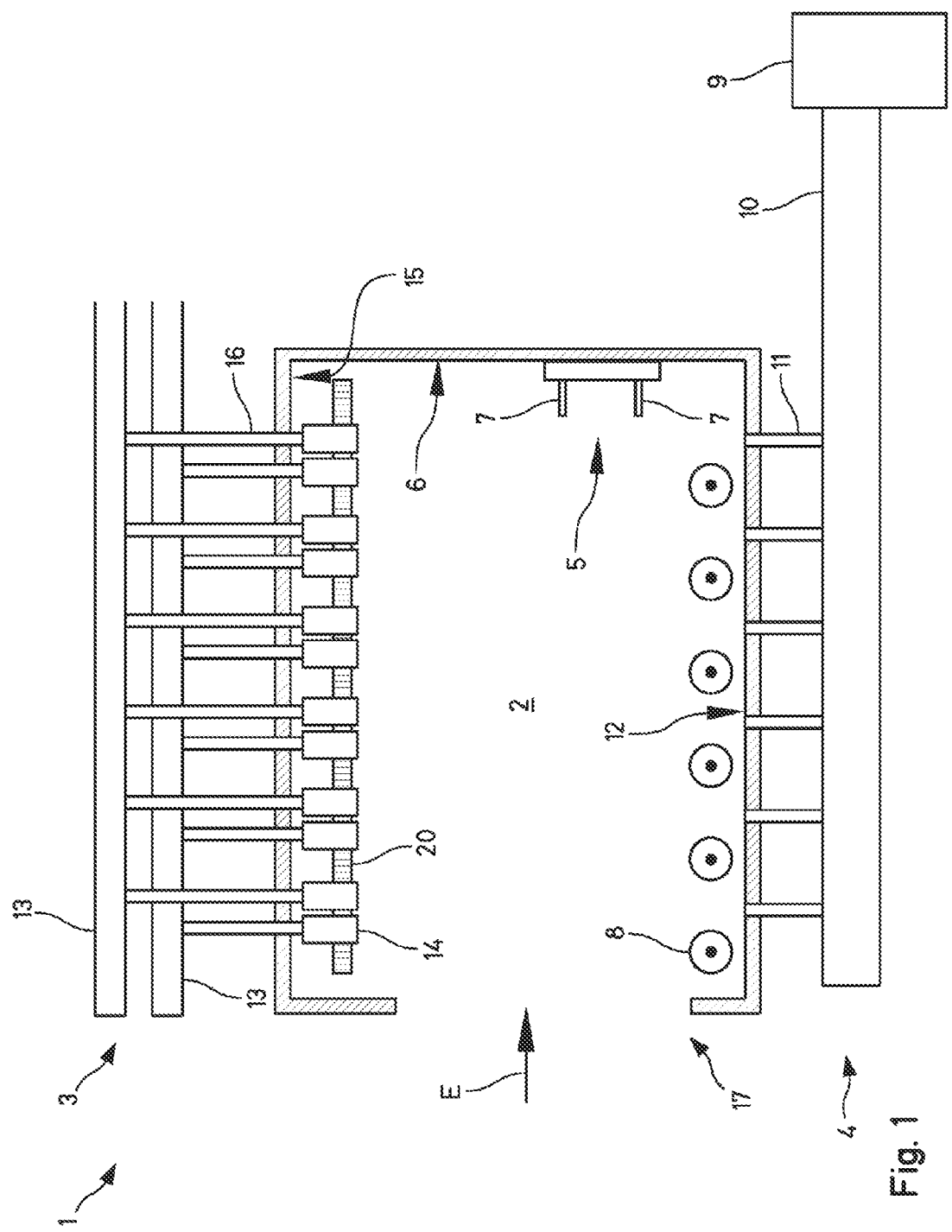
FIG. 1 shows an example of a device for plasma-enhanced vapor deposition in a side view.

FIG. 1 shows an example of a device 1 for plasma-enhanced vapor deposition in a side view. The device 1 has a process chamber 2 for receiving at least one workpiece carrier through a closable opening 17, a gas feed system 3 for feeding at least one process gas into the process chamber 2, and a gas discharge system 4 for generating a vacuum in the process chamber 2. The device 1 is configured here to heat the process chamber 2 with the aid of at least one workpiece carrier received by the process chamber 2.

For this purpose, the device 1 comprises a power connection 5 for electrically connecting the workpiece carrier to the device 1. The power connection 5 is preferably arranged here inside the process chamber 2, in particular in the area of a rear wall 6 of the process chamber 2. The power connection 5 preferably has multiple contact pins 7, which are sometimes also referred to as power lances. The contact pins 7 are preferably arranged in such a way that a workpiece carrier inserted into the process chamber 2 comes into contact with the contact pins 7 on the rear wall 6.

The power connection 5 is preferably part of a switching unit (see FIG. 3) of the device 1, which is configured to integrate at least one workpiece carrier receivable by the process chamber 2 for the heating of the process chamber 2 via the power connection 5 into at least one heating circuit for conducting low-frequency alternating current. In addition, the switching unit can also be configured to integrate the receivable workpiece carrier via the power connection 5 into a plasma circuit for conducting a high-frequency alternating current, in order to generate a plasma in the process chamber 2.

Rollers 8 are preferably arranged in the process chamber 2 for inserting the at least one workpiece carrier into the process chamber 2. The rollers 8 can have, for example, a concave running surface, by which running rails of the workpiece carrier are guided (see FIG. 2). The rollers 8 are arranged here along an insertion direction E, in which the at least one workpiece carrier is insertable into the process chamber 2. The rollers 8 also enable, in addition to easy insertion of the at least one workpiece carrier into the process chamber 2, a precise alignment of the workpiece carrier in the process chamber 2. It can thus be ensured that the contact pins 7 reliably contact predefined contact points on an end facing toward the power connection 5 of the workpiece carrier receivable by the process chamber 2. For reasons of clarity, only one of the rollers 8 is provided with a reference sign.

After the at least one workpiece carrier has been inserted into the process chamber 2 via the rollers 8 and the opening 17 of the process chamber 2 has been closed tight, for example with the aid of a door or flap (see FIG. 2), gas located in the process chamber 2 can be extracted via the gas discharge system 4. The gas discharge system 4 expediently has at least one vacuum pump 9 for this purpose, which is connected, for example, via gas exhaust lines 10 to the process chamber 2. The gas discharge system 4 preferably moreover has multiple gas outlets 11, which originate from a bottom 12 of the process chamber 2 and discharge into the gas exhaust lines 10. Due to the number of the multiple gas outlets 11, gas located in the process chamber 2 can be extracted uniformly. The uniform extraction can be improved still further in that the gas outlets 11 are arranged distributed over the bottom 12 of the process chamber 2, for example as shown in FIG. 1 in a series parallel to the insertion direction E. For reasons of clarity, only one of the gas outlets 11 is provided with a reference sign.

If the process chamber has been heated with the aid of at least one workpiece carrier receivable by the process chamber 2 up to a process temperature for vapor deposition, the at least one process gas can be introduced into the process chamber 2 with the aid of the gas feed system 3. The gas feed system 3 has for this purpose in the example shown two gas feed lines 13, which are each connectable to a process gas supply, for example to a process gas tank or a process gas supply line. The gas feed line system 3 preferably moreover has multiple injectors 14, which can blow process gases guided by the gas feed lines 13 into the process chamber 2. The injectors 14, which are expediently arranged inside the process chamber 2, in particular in the area of a ceiling 15 of the process chamber 2, can be connected here, for example, via injector feed lines 16 to the gas feed lines 13. For reasons of clarity, only one of the injectors 14 and only one of the injector feed lines 16 is provided with a reference sign.

The multiple injectors 14 are preferably designed like nozzles and are arranged in such a way that the process gases guided by the two gas feed lines 13 can be blown in a targeted manner into the process chamber 2, in particular in the direction of a workpiece carrier received by the process chamber 2. The injectors 14 can be arrayed in particular, similarly to the gas outlets 11, in the insertion direction E. All injectors 14 assigned to one gas feed line and thus one process gas preferably form a row as such in this case.

When the injectors 14 on the ceiling 15 of the process chamber 2 and the openings of the gas outlets 11 in the bottom 12 of the process chamber 2 are opposite to one another, as indicated in the example shown here, this can significantly facilitate maintaining a homogeneous concentration of the introduced process gas in the process chamber 2. The homogeneous process conditions thus resulting can ensure that simultaneously processed workpieces have uniform properties.

To be able to use the heat generated upon heating of the process chamber optimally, the device 1 preferably has at least one reflection unit 20 for reflecting electromagnetic radiation, in particular thermal radiation from the infrared range of the electromagnetic spectrum. The at least one reflection unit 20 is preferably formed by stacked plates. The multiple plates of a stack can be manufactured here from different materials for reflecting radiation having different wavelengths, for example, to be able to efficiently reflect thermal radiation over a broad wavelength range.

In the example shown, one reflection unit 20 is arranged on the ceiling 15 of the process chamber 2, in particular in parallel to the ceiling 15, so that electromagnetic radiation emitted from the workpiece carrier received in the process chamber 2 in the direction of the ceiling 15 is reflected back to the workpiece carrier. The process chamber 2 may thus heat up faster.

So as not to impair the feed of process gas into the process chamber 2, the reflection unit 20 preferably has boreholes in the form of passages, which are penetrated by the injectors 14. It is also conceivable here that, in contrast to the example shown here, the injectors 14 terminate flush with the reflection unit 20.

Figure 2:
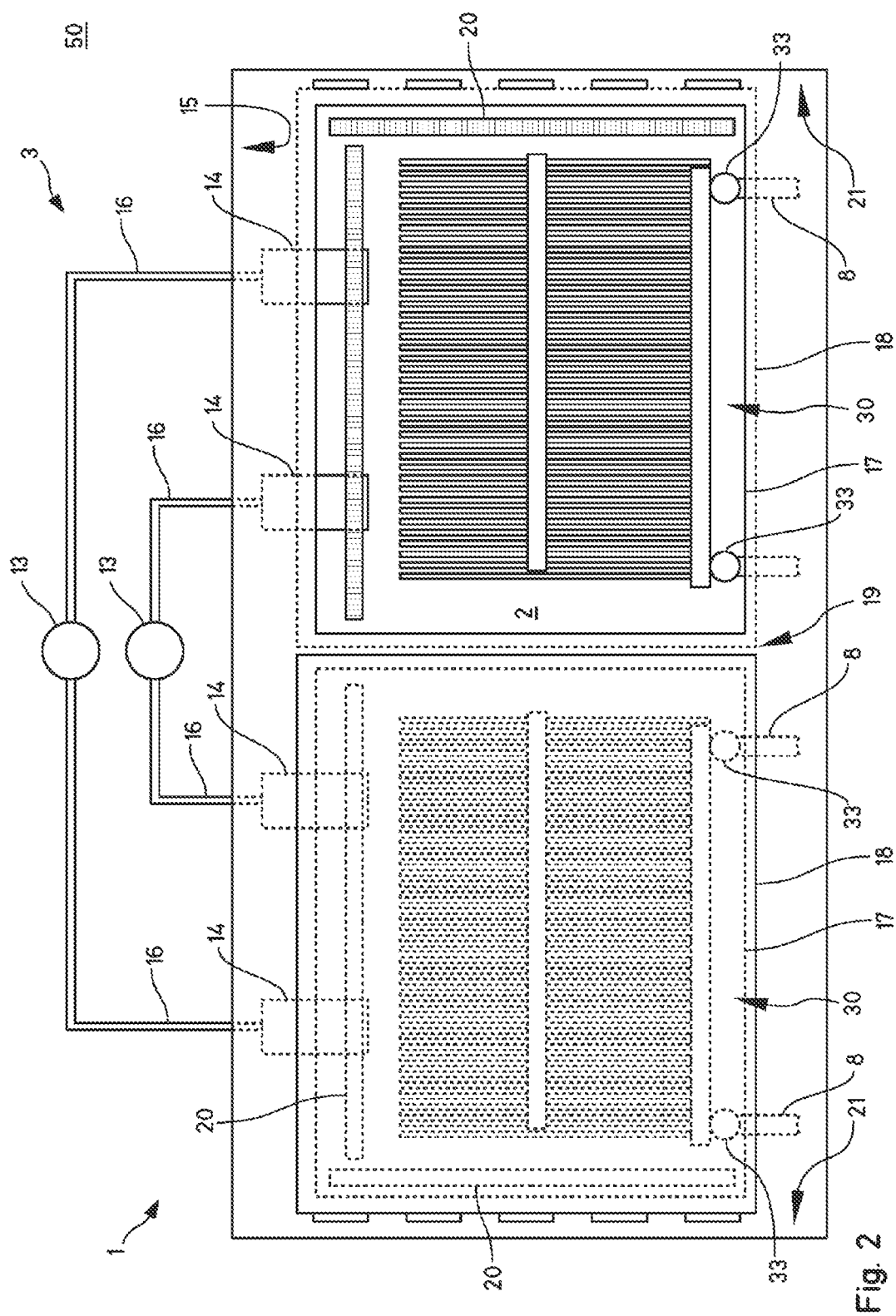
FIG. 2 shows an example of a system for plasma-enhanced vapor deposition.

FIG. 2 shows a system 50 for plasma-enhanced vapor deposition. The system 50 has the device 1 for plasma-enhanced vapor deposition having a process chamber 2, by which at least one workpiece carrier 30 is receivable, and at least one workpiece carrier 30. The device 1 is shown in a frontal view in FIG. 1 and is configured to heat the process chamber 2 with the aid of the at least one received workpiece carrier 30.

The device 1 shown here is designed similarly to the device shown in FIG. 1, wherein an illustration of the gas discharge system was omitted for reasons of clarity, however. Components or assemblies which are concealed by other components or assemblies are shown by dashed lines in the present case.

In the present example, the process chamber 2 is configured to receive two workpiece carriers 30 adjacent to one another, i.e., two workpiece carriers 30 arrayed transversely to an insertion direction (see FIG. 1). The process chamber 2 expediently has two openings 17 arranged adjacent to one another, which are closable with the aid of doors 18, for the insertion of the workpiece carriers 30. In the example shown, only the left door 18 in FIG. 2 is shown and thus conceals one of the openings 17. The right door 18 in FIG. 2 is shown as transparent.

The two openings 17 are preferably separated from one another by a stop web 19 for the doors 18. The process chamber 2 extends behind the stop web 19, but expediently behind both openings 17. That is to say, no gas separation exists between the two areas in which the workpiece carriers 30 are received by the process chamber 2.

The device 1 is preferably provided with rollers 8 arranged in the process chamber 2, in order to facilitate the insertion of the workpiece carriers 30. The workpiece carriers preferably have corresponding running rails 33 here, which can be guided via a concave running surface of the rollers 8. Alternatively, however, other guide systems for guiding the workpiece carriers 30 in the process chamber 2 are also conceivable. For example, the workpiece carriers 30 can also be provided with rollers, which can roll on running rails in the process chamber 2. In another variant, sliding elements can also be provided, to save installation space in relation to the variants having rollers.

As is also very apparent in FIG. 2, the process chamber 2 is preferably made rectangular. Rectangular workpiece carriers 30 can thus be received efficiently, i.e., unused space, also referred to as dead volume, in the process chamber 2 can be avoided or at least reduced. This in turn facilitates the generation of a vacuum in the process chamber 2 and can reduce the consumption of process gas.

Two gas feed lines 13 of a gas feed system 3 extend above the process chamber 2 in the example shown. Injector feed lines 16 expediently originate from each gas feed line 13 on two opposing sides, preferably in pairs. This enables a particularly uniform process gas feed for each of the two workpiece carriers 30 received by the process chamber 2. Injectors 14 connected to the injector feed lines 16 are preferably arranged here in the area of a ceiling 15 of the process chamber 2 in such a way that in each case two injectors 14 for blowing in different process gases for one of the received workpiece carriers 30 are adjacent to one another. As a result, for example, trimethyl amine (TMA) can be fed by at least one injector 14 and monosilane ($SiH_4$), ammonia ($NH_3$), nitrous oxide ($N_2O$), or methane ($CH_4$) can be fed by at least one further injector 14.

Alternatively, however, more than two gas feed lines 13 having corresponding injector feed lines to further injectors are also conceivable, in order to be able to feed further process gases at the same time. As such further process gases, at least one compound from a group consisting of monophosphane ($PH_3$), diborane ($B_2H_6$), and oxygen ($O_2$) can advantageously be fed.

Four reflection units 20 arranged in the process chamber 2 are also shown in FIG. 2. Two of the reflection units 20 are arranged in the area of the ceiling 15 of the process chamber 2, with received workpiece carriers 30, in particular above the workpiece carriers 30. Two further reflection units 20 are arranged in the area of side walls 21 of the process chamber 2, with received workpiece carriers 30, in particular in each case along a lateral surface of a workpiece carrier 30. Electromagnetic radiation emitted by the workpiece carriers 30 upon heating of the process chamber 2 can thus be reflected back to the workpiece carriers 30.

The same effect can also be achieved if, instead of two reflection units 20 in the area of the ceiling 15, only one reflection unit 20 is provided which extends essentially over the entire width of the process chamber 2. An embodiment having at least three reflection units 20 is therefore already advantageous.

Figure 3:
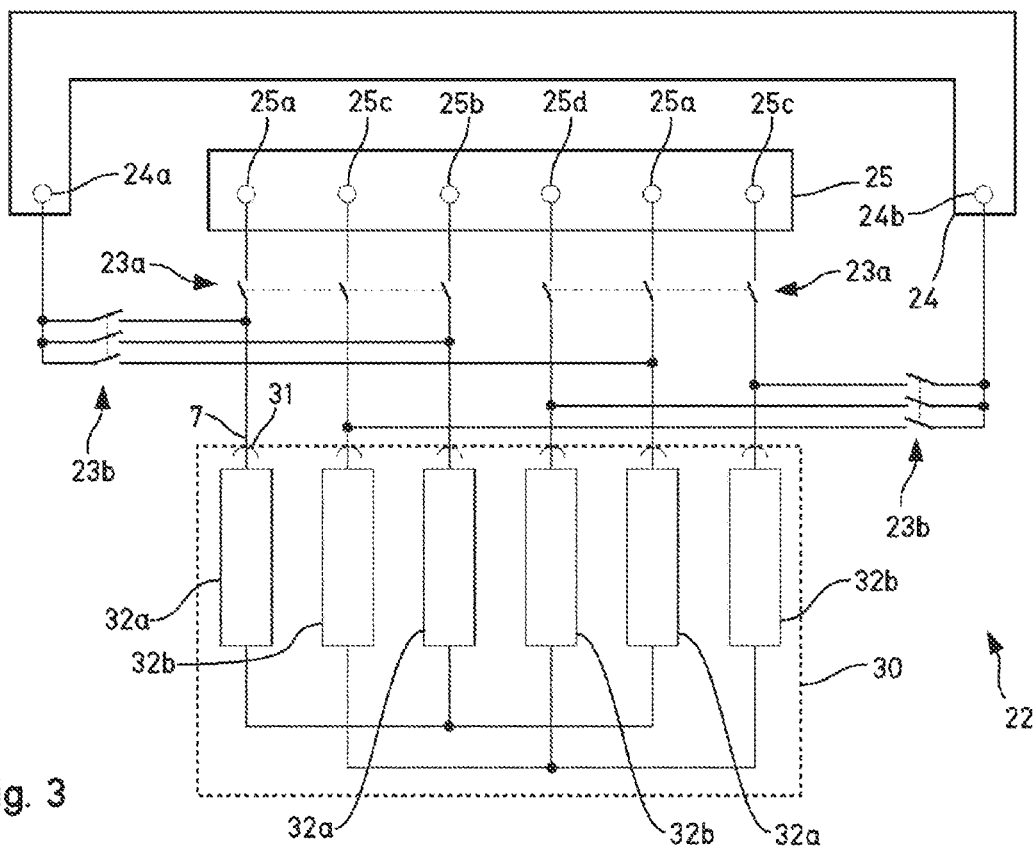
FIG. 3 shows an example of a system for plasma-enhanced vapor deposition.

FIG. 3 shows an example of a switching unit 22. The switching unit 22 is preferably configured to operate a workpiece carrier 30 receivable by a process chamber of a device for plasma-enhanced vapor deposition in a first operating mode as a heating unit for heating the process chamber, and to operate the workpiece carrier 30 in a second operating mode as a plasma unit for generating a plasma from at least one process gas fed into the process chamber.

The switching unit 22 expediently comprises for this purpose multiple switch assemblies 23a, 23b, a plasma voltage source 24 for providing a high-frequency AC voltage to be able to generate a plasma, and at least one heating voltage source 25 for providing a low-frequency AC voltage to be able to heat the process chamber.

The switching unit 22 is preferably designed in such a way that the workpiece carrier 30 is electrically contacted upon the receiving of the workpiece carrier 30 by the process chamber. The switching unit 22 can thus selectively establish an electrical connection between the plasma voltage source 24 or the at least one heating voltage source 25 and the workpiece carrier 30. The switching unit 22 can have for this purpose, for example, a power connection having multiple contact pins 7 arranged in the process chamber. With the aid of the contact pins 7, for example, corresponding contact points 31 of the workpiece carrier 30 can be contacted. For reasons of clarity, only one of the contact points 31 and only one of the contact pins 7 is provided with a reference sign.

The switching unit 22 is preferably configured first to electrically connect the at least one heating voltage source 25 to the workpiece carrier 30 receivable by the process chamber, for example by closing a first switch assembly 23a. The switching unit 22 can be configured in particular to integrate the workpiece carrier 30 into at least one heating circuit by establishing this electrical connection.

The switching unit 22 can be designed, for example, in such a way that upon closing of the first switch assembly 23a (i) low-frequency electrical alternating current flows between two poles 25a, 25b of the at least one heating voltage source 25 through a first group of electrodes 32a of an electrode assembly of the workpiece carrier 30 receivable by the process chamber and (ii) low-frequency electrical alternating current flows between two further poles 25c, 25d of the at least one heating voltage source 25 through a second group of electrodes 32b of the electrode assembly. As can be seen in FIG. 3, the electrodes 32a, 32b of a group are each electrically connected in series. In the present case, four heating circuits are implemented using the interconnection shown in the example shown and by two poles 54a and 54c being provided.

Since the electrodes 32a, 32b can act as heating resistors when the first switch assembly 23a is closed, the workpiece carrier 30 is therefore operable as a heating unit in a first operating mode.

The switching unit 22 is preferably furthermore configured to disconnect the heating voltage source 25 from the workpiece carrier 30 receivable by the process chamber and instead to electrically connect the plasma voltage source 24 to the workpiece carrier 30, for example by opening the first switch assembly 23a and closing a second switch assembly 23b. The switching unit 22 can in particular be configured to integrate the workpiece carrier 30 into a plasma circuit by establishing this electrical connection.

The switching unit 22 can be designed, for example, in such a way that upon closing of the second switch assembly 23b, a high-frequency electrical AC voltage is applied between the electrodes 32a of the first group and the electrodes 32b of the second group. For this purpose, the switching unit 22 can be designed in particular in such a way that upon closing of the second switch assembly 23b, a first pole 24a of the plasma voltage source 24 is connectable to the electrodes 32a of the first group and a second pole 24b is connectable to the electrodes 32b of the second group.

Since the electrodes 32a of the first group and the electrodes 32b of the second group are preferably arranged alternately as shown in FIG. 3 and with closed second switch assembly 23b high-frequency electrical fields can thus be generated to generate a plasma, the workpiece carrier 30 is therefore operable as a plasma unit in a second operating mode.

The corresponding control of the switch assemblies 23a, 23b can be carried out by a control unit, which is not shown for reasons of clarity in FIG. 3, however.

Figure 4:
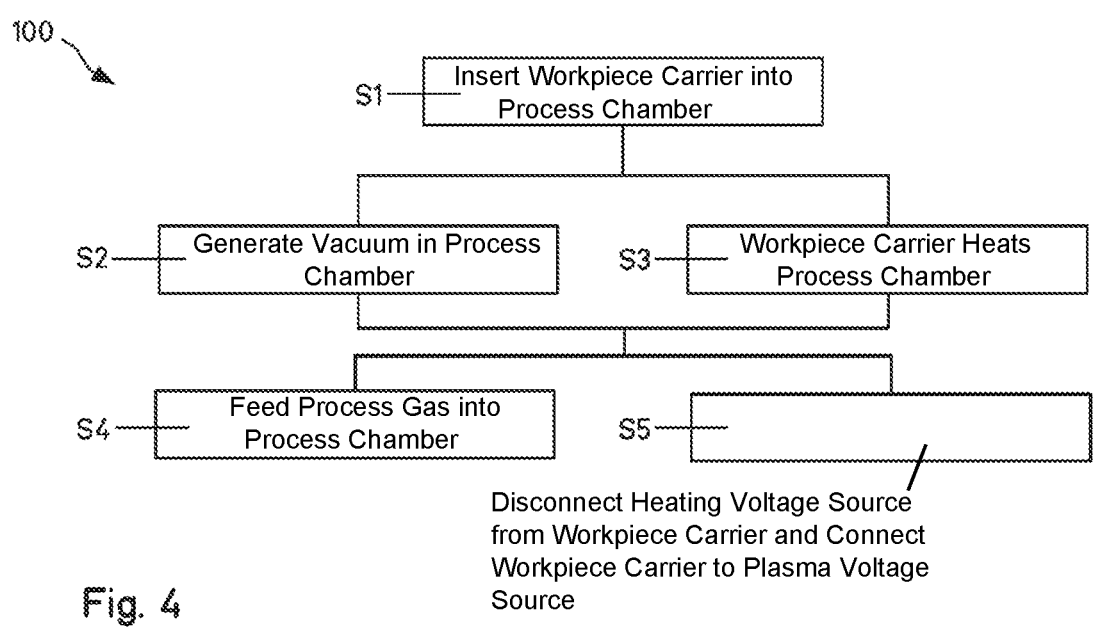
FIG. 4 shows an example of a method for plasma-enhanced vapor deposition.

FIG. 4 shows an example of a method 100 for plasma-enhanced chemical vapor deposition.

Preferably, in a method step S1, at least one workpiece carrier is inserted into a process chamber of a device for plasma-enhanced chemical vapor deposition. For this purpose, the workpiece carrier can be inserted, for example, via a guide system, for example rollers arranged in the process chamber, through an opening in the process chamber. The workpiece carrier is at the same time electrically interconnected in a preferred manner to a switching unit of the device. For example, the workpiece carrier can be inserted into the process chamber until contact points on the workpiece carrier are in contact with contact pins of a power connection of the device arranged in the region of a rear wall of the process chamber.

If the at least one workpiece carrier has been received by the process chamber, i.e., is completely inserted, in a further method step S2, a vacuum is preferably generated in the process chamber. Gas located in the process chamber can be extracted here with the aid of a gas discharge system, in particular via multiple gas outlets in the process chamber. Providing multiple gas outlets, in particular distributing the gas outlets over the bottom of the process chamber, enables particularly efficient evacuation of the process chamber.

In a further method step S3, the process chamber is heated with the aid of at least one received workpiece carrier. For this purpose, the workpiece carrier can be integrated by the switching unit in at least one heating circuit for conducting low-frequency alternating current. The workpiece carrier is preferably connected here to at least one heating voltage source to provide a low-frequency AC voltage. A low-frequency electrical alternating current can thus be conducted through at least a part of the workpiece carrier, for example through multiple electrodes connected in series, so that the workpiece carrier heats up at least in sections.

If the temperature within the process chamber, in particular the temperature of the workpiece carrier, has reached or exceeded a predetermined process temperature, in a further method step S4, at least one process gas, for example a silane such as $SiH_4$, a trimethyl, and/or laughing gas $N_2O$ can be fed into the process chamber. The at least one process gas can be blown homogeneously distributed into the process chamber in particular via multiple injectors, which are preferably arranged in the area of a ceiling of the process chamber.

In a further method step S5, the at least one heating voltage source is preferably disconnected from the at least one received workpiece carrier. Instead, the workpiece carrier can be integrated by the switching unit into a plasma circuit for conducting high-frequency alternating current. The workpiece carrier is preferably connected in this case to a plasma voltage source to provide a high-frequency electrical AC voltage. Two components or component groups, in particular two different electrode groups, can thus be occupied with two different potentials, so that high-frequency electrical alternating fields form between the electrodes to generate a plasma from the at least one fed process gas.

The above-described sequence of method steps S2 to S5 is not required here. Rather, it is conceivable that, as indicated in FIG. 4, method steps S2 and S3 are at least temporarily executed simultaneously. Method steps S4 and S5 can also be executed simultaneously. Method step S2 is preferably executed, i.e., the generated vacuum is maintained, until the desired deposition has been achieved on a workpiece carried by the workpiece carrier.

LIST OF REFERENCE SIGNS 1 device
2 process chamber
3 gas feed system
4 gas discharge system
5 power connection
6 rear wall
7 contact pin
8 roller
9 vacuum pump
10 gas exhaust line
11 gas outlet
12 bottom
13 gas feed line
14 injector
15 ceiling
16 injector feed line
17 opening
18 door
19 stop web
20 reflection unit
21 side wall
22 switching unit
23a, 23b switch assembly
24 plasma voltage source
24a, 24b pole
25 heating voltage source
25a-d pole
30 workpiece carrier
31 contact point
32a, 32b electrode
50 system
100 method
S1-S5 method step

The invention claimed is:

1. A device for plasma-enhanced chemical vapor deposition, the device comprising:
a process chamber;
a switching unit configured to selectively connect at least one workpiece carrier received in said process chamber to at least one heating voltage source or a plasma voltage source, and to selectively integrate said at least one workpiece carrier, via a power connection, for operation:
as a plasma unit into a single plasma circuit for conducting high-frequency alternating current, or
as a heating unit into at least two heating circuits for conducting low-frequency alternating current, such that said process chamber is heatable using said at least one workpiece carrier received in said process chamber.

2. The device according to claim 1, wherein said switching unit includes at least two switch assemblies configured to interrupt electrically conductive connections of said at least one heating voltage source and said plasma voltage source to said power connection to be connected to said at least one workpiece carrier.

3. The device according to claim 2, wherein said power connection has at least four contact pins for electrically contacting said at least one workpiece carrier.

4. The device according to claim 3, wherein said process chamber has a rear wall, and said at least four contact pins are disposed in a region of said rear wall.

5. The device according to claim 1, wherein said process chamber is configured to receive two workpiece carriers.

6. The device according to claim 1, wherein said process chamber has two closable openings disposed adjacent one another for inserting said at least one workpiece carrier into said process chamber.

7. The device according to claim 1, wherein said process chamber has at least one reflection unit configured to reflect electro-magnetic radiation emitted from said at least one workpiece carrier back onto said at least one workpiece carrier.

8. The device according to claim 7, wherein said at least one workpiece carrier has two opposing longitudinal sides, and said at least one reflection unit includes at least three reflection units disposed in at least two pairs of two reflection units being oriented substantially at a right angle to one another and positioned above and along said two opposing longitudinal sides, with said at least one workpiece carrier received in said process chamber.

9. The device according to claim 1, wherein said process chamber has a ceiling, and a gas feed system for feeding a process gas into said process chamber includes a plurality of injectors disposed in a region of said ceiling for feeding said process gas above said at least one workpiece carrier received in said process chamber.

10. The device according to claim 1, which further comprises a gas feed system for feeding a process gas into said process chamber, said gas feed system including a plurality of injectors for targeted injection of said process gas.

11. The device according to claim 10, wherein said at least one workpiece carrier has a plurality of electrodes disposed in parallel, and said injectors are disposed and configured to blow said process gas in between said electrodes.

12. The device according to claim 1, wherein said process chamber has a bottom, and a gas discharge system for generating a vacuum in said process chamber includes a plurality of gas outlets disposed in a region of said bottom below said at least one workpiece carrier, to extract a process gas when said at least one workpiece carrier is received in said process chamber.

13. A system for plasma-enhanced chemical vapor deposition, the system comprising:
a device according to claim 1; and a workpiece carrier receivable by said process chamber of the device.

14. A method for plasma-enhanced chemical vapor deposition, the method comprising:
  providing a device according to claim 1;
  receiving at least one workpiece carrier in the process chamber; and
  using the at least one workpiece carrier to heat the process chamber.

* * * * *